United States Patent
Chen et al.

(10) Patent No.: US 11,539,332 B2
(45) Date of Patent: Dec. 27, 2022

(54) AMPLIFICATION CIRCUIT WITH OVER POWER PROTECTION

(71) Applicant: RichWave Technology Corp., Taipei (TW)

(72) Inventors: Chih-Sheng Chen, Taipei (TW); Tien-Yun Peng, Taipei (TW)

(73) Assignee: RichWave Technology Corp., Taipei (TW)

( * ) Notice: Subject to any disclaimer, the term of this patent is extended or adjusted under 35 U.S.C. 154(b) by 186 days.

(21) Appl. No.: 17/140,135

(22) Filed: Jan. 4, 2021

(65) Prior Publication Data
US 2022/0115994 A1 Apr. 14, 2022

(30) Foreign Application Priority Data

Oct. 14, 2020 (TW) .................................. 109135425

(51) Int. Cl.
*H03F 1/52* (2006.01)
*H03F 3/19* (2006.01)
*H03K 5/24* (2006.01)

(52) U.S. Cl.
CPC ................ *H03F 1/52* (2013.01); *H03F 3/19* (2013.01); *H03K 5/24* (2013.01); *H03F 2200/426* (2013.01); *H03F 2200/451* (2013.01)

(58) Field of Classification Search
CPC ................ H03F 1/52; H03F 3/19; H03K 5/24
See application file for complete search history.

(56) References Cited

U.S. PATENT DOCUMENTS

| 4,016,460 | A | * | 4/1977 | Stadler | ...................... H03F 1/52 361/88 |
|---|---|---|---|---|---|
| 6,188,277 | B1 | | 2/2001 | Borodulin | |
| 10,320,351 | B1 | * | 6/2019 | Liu | ......................... H03F 1/303 |
| 10,666,205 | B2 | | 5/2020 | Wallis | |
| 10,763,913 | B1 | * | 9/2020 | Khatri | ...................... H03F 3/19 |

(Continued)

FOREIGN PATENT DOCUMENTS

| CN | 103457548 A | 12/2013 |
|---|---|---|
| CN | 103888088 A | 6/2014 |

(Continued)

OTHER PUBLICATIONS

Notice of Allowance dated Mar. 24, 2022 for the Taiwan application No. 110105878, filing date Oct. 14, 2020, pp. 1-4., Mar. 24, 2022.

*Primary Examiner* — Patricia T Nguyen
(74) *Attorney, Agent, or Firm* — Winston Hsu

(57) ABSTRACT

An amplification circuit includes a switch circuit, an amplifier, and a control circuit. The switch circuit has a first terminal coupled to a radio frequency signal input terminal or a system voltage terminal, a second terminal coupled to an input terminal of the amplifier, and a control terminal configured to receive a control signal. The amplifier amplifies a radio frequency signal. The control circuit generates the control signal according to a driving current generated by the amplifier. When the control circuit determines that the amplifier operates in a high power mode, the control circuit controls the control signal to adjust a conducting level between the first terminal and the second terminal of the switch circuit according to the intensity of the driving current.

20 Claims, 8 Drawing Sheets

(56) References Cited

U.S. PATENT DOCUMENTS

| | | | |
|---|---|---|---|
| 2014/0240884 A1 | 8/2014 | Chang | |
| 2014/0285262 A1 | 9/2014 | Kojima | |
| 2015/0381161 A1 | 12/2015 | Zhang | |
| 2016/0056774 A1* | 2/2016 | Ilkov | H03F 3/19 330/251 |
| 2018/0198428 A1* | 7/2018 | Hanafi | H03F 3/245 |
| 2021/0119524 A1* | 4/2021 | Chen | H02M 3/156 |

FOREIGN PATENT DOCUMENTS

| | | |
|---|---|---|
| CN | 102801390 B | 1/2015 |
| CN | 107493083 A | 12/2017 |
| CN | 107834985 A | 3/2018 |
| CN | 110731048 A | 1/2020 |
| TW | 201044773 A1 | 12/2010 |
| WO | 2011/102092 A1 | 8/2011 |
| WO | 2013/097361 A1 | 7/2013 |

* cited by examiner

AMPLIFICATION CIRCUIT WITH OVER POWER PROTECTION

CROSS REFERENCE TO RELATED APPLICATION

This non-provisional application claims priority of Taiwan patent application No. 109135425, filed on 14 Oct. 2020, included herein by reference in its entirety.

TECHNICAL FIELD

The present invention relates to an amplifier circuit, and in particular, an amplifier circuit providing over power protection.

BACKGROUND

In wireless communications, since the operating conditions may vary with time and location, in order to ensure the quality of signal transmission, an amplifier is often used to amplify the transmission signal to enhance the quality of signal transmission and signal reception. However, when the power of the input signal is too high, the transistor in the amplifier may be forced to operate at a higher bias voltage and generate a higher driving current. In such a case, the transistor may be damaged by the excessive bias voltage and the excessive driving current, resulting in abnormal operation of the amplifier.

In the related art, a diode is often placed at the input terminal of the amplifier to clamp the electric potential of the input signal, but the characteristics of the diode would degrade the linearity of the amplifier and the performance of the amplifier.

SUMMARY

According to an embodiment of the invention, an amplifier circuit includes a switch circuit, an amplifier and a control circuit. The switch circuit includes a first terminal coupled to a radio frequency signal input terminal or a first system voltage terminal, a second terminal, and a control terminal used to receive a control signal. The amplifier includes an input terminal coupled to the second terminal of the switch circuit and used to receive a radio frequency signal, and an output terminal used to output an amplified radio frequency signal. The control circuit is coupled to the amplifier, and is used to generate the control signal according to a driving current generated by the amplifier. When the control circuit determines that the amplifier is operating in a high power state, the control circuit is used to control the control signal according to a magnitude of the driving current to adjust a conduction level between the first terminal and the second terminal of the switch circuit.

DETAILED DESCRIPTION

Figure 1:
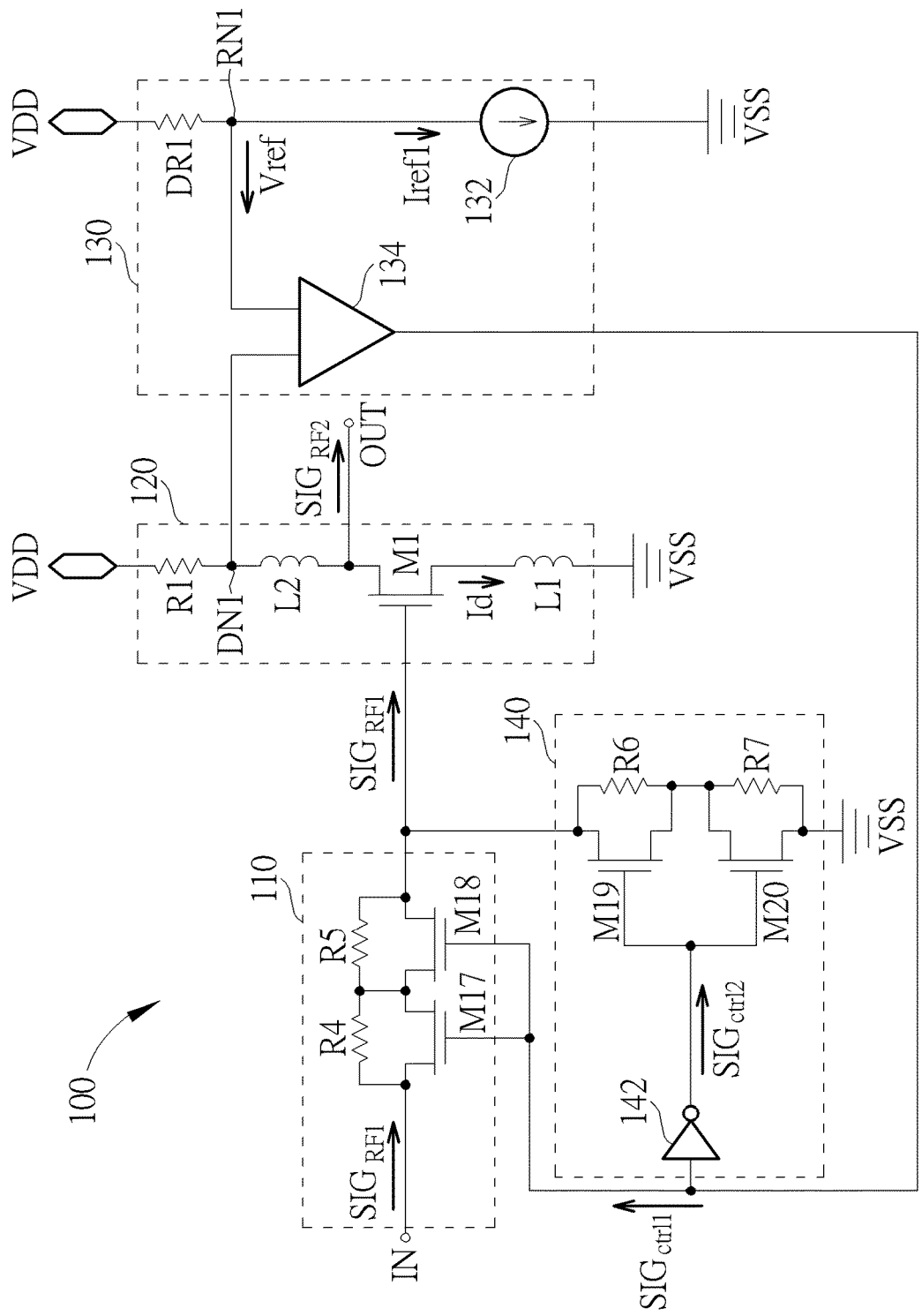
FIG. 1 is a schematic diagram of an amplifier circuit according to an embodiment of the invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 is a schematic diagram of an amplifier circuit 100 according to an embodiment of the invention. The amplifier circuit 100 includes a switch circuit 110, an amplifier 120 and a control circuit 130.

The switch circuit 110 has a first terminal, a second terminal and a control terminal. The first terminal of the switch circuit 110 may be coupled to a radio frequency signal input terminal IN, and the control terminal of the switch circuit 110 may receive the first control signal $SIG_{ctrl1}$.

The amplifier 120 has an input terminal and an output terminal. The input terminal of the amplifier 120 may be coupled to the second terminal of the switch circuit 110 and may receive the radio frequency signal $SIG_{RF1}$, and the output terminal OUT of the amplifier 120 may output the amplified radio frequency signal $SIG_{RF2}$.

The control circuit 130 may be coupled to the amplifier 120, and the control circuit 130 may generate the first control signal $SIG_{ctrl1}$ according to the driving current Id generated by the amplifier 120, wherein the magnitude of the driving current Id is related to the power of the radio frequency signal $SIG_{RF1}$. For example, the higher the power of the radio frequency signal $SIG_{RF1}$ is, the higher the driving current Id generated by the amplifier 120 will be.

In some embodiments, when the control circuit 130 determines that the amplifier 120 is operating in a low power state, the power of the radio frequency signal $SIG_{RF1}$ is not large enough to damage the amplifier 120, and the control circuit 130 may control the first control signal $SIG_{ctrl1}$ to turn on the switch circuit 110.

However, when the control circuit 130 determines that the amplifier 120 is operating in a first high-power state, the power of the radio frequency signal $SIG_{RF1}$ is relatively large and sufficient to damage the amplifier 120. Therefore, the control circuit 130 may control the first control signal $SIG_{ctrl1}$ according to the magnitude of the driving current Id to adjust the conduction level between the first terminal and the second terminal of the switch circuit 110. That is, in the first high power state, the conduction level of the switch circuit 110 will vary with the magnitude of the driving current Id. For example, when the driving current Id is large, the power of the radio frequency signal $SIG_{RF1}$ is higher, and the control circuit 130 may reduce the conduction level between the first terminal and the second terminal of the switch circuit 110 to reduce the power of the received radio frequency signal $SIG_{RF1}$ received by the amplifier 120. In this manner, the inside of the transistor may be prevented from being damaged by an excess voltage from the input terminal of the amplifier 120 owing to the high power of the radio frequency signal $SIG_{RF1}$.

Further, when the control circuit 130 determines that the amplifier 120 is operating in a second high power state, i.e., when the power of the radio frequency signal $SIG_{RF1}$ is excessively high, the control circuit 130 may control the first control signal $SIG_{ctrl1}$ to turn off the switch circuit 110 to prevent the amplifier 120 from being damaged.

In FIG. 1, the control circuit 130 may include a comparator 134. The control circuit 130 may further include a current source 132 and/or a reference resistor DR1. The comparator 134 has a first input terminal, a second input terminal and an output terminal. The first input terminal of the comparator 134 may be coupled to the detection node DN1, and the second input terminal of the comparator 134 may be coupled to the reference node RN1 to receive the reference voltage Vref. The detection node DN1 may be configured inside the amplifier 120. The reference resistor DR1 has a first terminal and a second terminal. The first terminal of the reference resistor DR1 may be coupled to a system voltage terminal VDD, and the second terminal of the reference resistor DR1 may be coupled to the reference node RN1 to generate the reference voltage Vref according to the reference current Iref1. The current source 132 may be coupled to the second terminal of the reference resistor DR1, and may provide a reference current Iref1 to generate a voltage difference across the reference resistor DR1.

The comparator 134 may output the first control signal $SIG_{ctrl1}$ according to the voltage at the first input terminal and the voltage at the second input terminal. In some embodiments, the voltage of the detection node DN1 is related to the driving current Id. Therefore, if the reference node RN1 is set at an appropriate voltage, the change in the driving current Id may be obtained by comparing the voltage at the detection node DN1 and the voltage at the reference node RN1, thereby outputting the corresponding first control signal $SIG_{ctrl1}$.

In FIG. 1, the amplifier 120 may include a resistor R1 and a transistor M1. The amplifier 120 may further include an inductor L1. The resistor R1 has a first terminal and a second terminal. The first terminal of the resistor R1 may be coupled to the system voltage terminal VDD, and the second terminal of the resistor R1 may be coupled to the detection node DN1. The transistor M1 has a first terminal, a second terminal and a control terminal. The first terminal of the transistor M1 may be coupled to the detection node DN1, and the control terminal of the transistor M1 may be coupled to the input terminal of the amplifier 120. The inductor L1 has a first terminal and a second terminal. The first terminal of the inductor L1 may be coupled to the second terminal of the transistor M1, and the second terminal of the inductor L1 may be coupled to a system voltage terminal VSS. In such a case, the control terminal of the transistor M1 may receive the radio frequency signal $SIG_{RF1}$, and when the power of the radio frequency signal $SIG_{RF1}$ is higher, the transistor M1 will generate a higher current, resulting in a larger voltage drop across and the resistance R1, and lowering the voltage at the detection node DN1.

In some embodiments, the amplifier 120 may further include an inductor L2, and the inductor L2 may be coupled between the resistor R1 and the transistor M1. The inductors L1 and/or L2 in the amplifier 120 may reduce undesired leakage of the radio frequency signal $SIG_{RF1}$ during amplification, so as to maintain the linearity of the amplifier 120.

In the amplifier circuit 100, the switch circuit 110 may include transistors M17 and M18. The transistor M17 has a first terminal, a second terminal and a control terminal. The first terminal of the transistor M17 may be coupled to the first terminal of the switch circuit 110, the control terminal of the transistor M17 may be coupled to the control terminal of the switch circuit 110. The transistor M18 has a first terminal, a second terminal and a control terminal. The first terminal of the transistor M18 may be coupled to the second terminal of the transistor M17, the control terminal of the transistor M18 may be coupled to the control terminal of the switch circuit 110.

Figure 2:
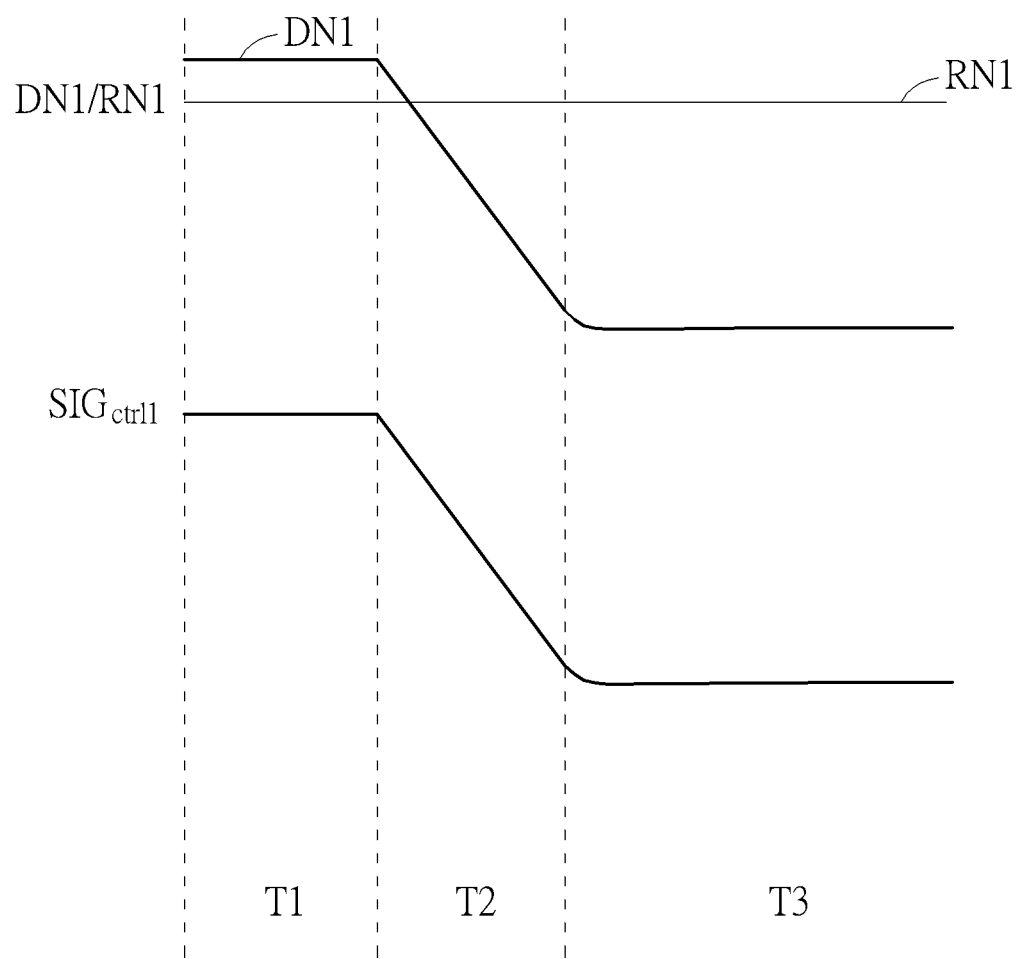
FIG. 2 shows waveforms of the node voltages and the control signal of the amplifier circuit in FIG. 1 in different power states.

FIG. 2 shows waveforms of the node voltages and the control signal of the amplifier circuit 100 in different power states. In some embodiments, the transistors M17 to M18 may be N-type transistors. In such a case, the voltage at the reference node RN1 may be set at slightly less than the voltage of the detection node DN1 for the radio frequency signal $SIG_{RF1}$ at low power. Consequently, in Period T1, when the amplifier circuit 100 is operating in the low power state, the comparator 134 will output a high-level first control signal $SIG_{ctrl1}$ to turn on the transistors M17 and M18 of the switch circuit 110. In Period T2, when the amplifier circuit 100 is operating in the first high power state, the detection node DN1 will drop slightly, and the first control signal $SIG_{ctrl1}$ output from the comparator 134 will be dynamically adjusted between a low potential and a high potential to dynamically adjust the conduction levels of the transistors M17 and M18, bringing the voltage at the detection node DN1 to approach the voltage at the reference node RN1. For example, in the first high power state, if the radio frequency signal $SIG_{RF1}$ varies from a low voltage to a high voltage, the switch circuit 110 will be turned on less. However, in Period T3, when the amplifier circuit 100 is operating in the second high power state, i.e., the power of the radio frequency signal $SIG_{RF1}$ is higher than in the first high power state, the voltage at the detection node DN1 will be significantly lowered, and the control circuit 130 has not been able to effectively adjust the voltage at the detection node DN1 to any closer to the voltage at the reference node RN1, and therefore, the comparator 134 will output the first control signal $SIG_{ctrl1}$ at a low level to turn off the transistors M17 and M18 of the switch circuit 110.

In some embodiments, the switch circuit 110 may further include resistors R4 and R5. The resistor R4 has a first terminal and a second terminal. The first terminal of the resistor R4 may be coupled to the first terminal of the transistor M17, and the second terminal of the resistor R4 may be coupled to the second terminal of the transistor M17. The resistor R5 has a first terminal and a second terminal. The first terminal of the resistor R5 may be coupled to the first terminal of the transistor M18, and the second terminal of the resistor R5 may be coupled to the second terminal of the transistor M18. The resistors R4 and R5 may be used to balance the drain-source voltages of the transistors M17 and M18, respectively.

In FIG. 1, the amplifier circuit 100 may further include a switch circuit 140. The switch circuit 140 has a first terminal, a second terminal and a control terminal. The first terminal of the switch circuit 140 may be coupled to the second terminal of the switch circuit 110, the second terminal of the switch circuit 140 may be coupled to the system voltage terminal VSS, and the control terminal of the switch circuit 140 may receive the first control signal $SIG_{ctrl1}$. The switch circuit 140 may provide a shunt path for the radio frequency signal $SIG_{RF1}$, thereby providing further protection to the amplifier 120 in a high power state.

In some embodiments, when the control circuit 130 determines that the amplifier 120 is operating in the low power state, the control circuit 130 may turn off the second switch circuit 140. When the control circuit 130 determines that the amplifier 120 is operating in the first high power state, the control circuit 130 may adjust a conduction level between the first terminal and the second terminal of the switch circuit 140 according to the magnitude of the driving current Id, the variation of the conduction level of the switch circuit 140 being negative correlated to the variation of the conduction level between the first terminal and the second terminal of the switch circuit 110. In other words, in the first high power state, the switch circuit 140 may be turned on in a limited manner to prevent the amplifier 120 from being damaged by the high-power radio frequency signal $SIG_{RF1}$. In some embodiments, in the first high power state, if the radio frequency signal $SIG_{RF1}$ varies from a low voltage to a high voltage, the switch circuit 140 will be turned on further. Furthermore, when the control circuit 130 determines that the amplifier 120 is operating in the second high power state, the control circuit 130 may turn on the switch circuit 140. In such a case, even if the radio frequency signal $SIG_{RF1}$ may go through the switch circuit 110, the radio frequency signal $SIG_{RF1}$ will also flow into the system voltage terminal VSS via the shunt path provided by the switch circuit 140 to prevent damage to the amplifier 120.

In FIG. 1, the switch circuit 140 may include transistors M19 and M20. The transistor M19 has a first terminal, a second terminal and a control terminal. The first terminal of the transistor M19 may be coupled to the first terminal of the switch circuit 140, and the control terminal of the transistor M19 may be coupled to the control terminal of the switch circuit 140. The transistor M20 has a first terminal, a second terminal and a control terminal. The first terminal of the transistor M20 may be coupled to the second terminal of the transistor M19, and the control terminal of the transistor M20 may be coupled to the control terminal of the switch circuit 140.

In some embodiments, the switch circuit 140 may further include an inverter 142. The inverter 142 has an input terminal and an output terminal. The input terminal of the inverter 142 may receive the first control signal $SIG_{ctrl1}$, and the output terminal of the inverter 142 may output the second control signal $SIG_{ctrl2}$. In other words, the first control signal $SIG_{ctrl1}$ of the switch circuit 110 and the second control signal $SIG_{ctrl2}$ of the switch circuit 140 may be opposite in phase. While the switch circuit 140 includes the inverter 142 to generate the second control signal $SIG_{ctrl2}$, in the embodiment in FIG. 1, the invention is not limited thereto. In some other embodiments, the control circuit 130 may further include a circuit to generate the second control signal $SIG_{ctrl2}$. In such a case, the inverter 142 may be eliminated from the switch circuit 140, and the switch circuit 140 may directly receive the second control signal $SIG_{ctrl2}$ related to the first control signal $SIG_{ctrl1}$. In the embodiment in FIG. 1, the switch circuit 140 may include an inverter 142, and the transistors M19 and M20 may be n-channel FETs. In other embodiments, the inverter 142 may be eliminated from the switch circuit 140 and the transistors M19 and M20 may be p-channel FETs, and the control terminals of the transistors M19 and M20 may directly receive the first control signal $SIG_{ctrl1}$.

The switch circuit 140 may further include resistors R6 and R7. The resistor R6 has a first terminal and a second terminal. The first terminal of the resistor R6 may be coupled to the first terminal of the transistor M19, and the second terminal of the resistor R6 may be coupled to the second terminal of the transistor M19. The resistor R7 has a first terminal and a second terminal. The first terminal of the resistor R7 may be coupled to the first terminal of the transistor M20, and the second terminal of the resistor R7 may be coupled to the second terminal of the transistor M20. The resistors R6 and R7 may be used to balance the drain-source voltages of the transistors M19 and M20, respectively.

In the embodiment in FIG. 1, the amplifier circuit 100 may use the switch circuits 110 and 140 to protect the amplifier 120, but the present invention is not limited thereto. In some embodiments of the present invention, the amplifier circuit 100 may also leave out the switch circuit 140 and yet provide protection to the amplifier 120 by the switch circuit 110. Alternatively, the switch circuit 110 may be eliminated and only the switch circuit 140 may be used to protect the amplifier 120. In other embodiments, the switch circuit 110 or the switch circuit 140 may include only one transistor. For example, the switch circuit 110 may only include one of the transistors M17 and M18, and the switch circuit 140 may include only one of the transistors M19 and M20.

Figure 3:
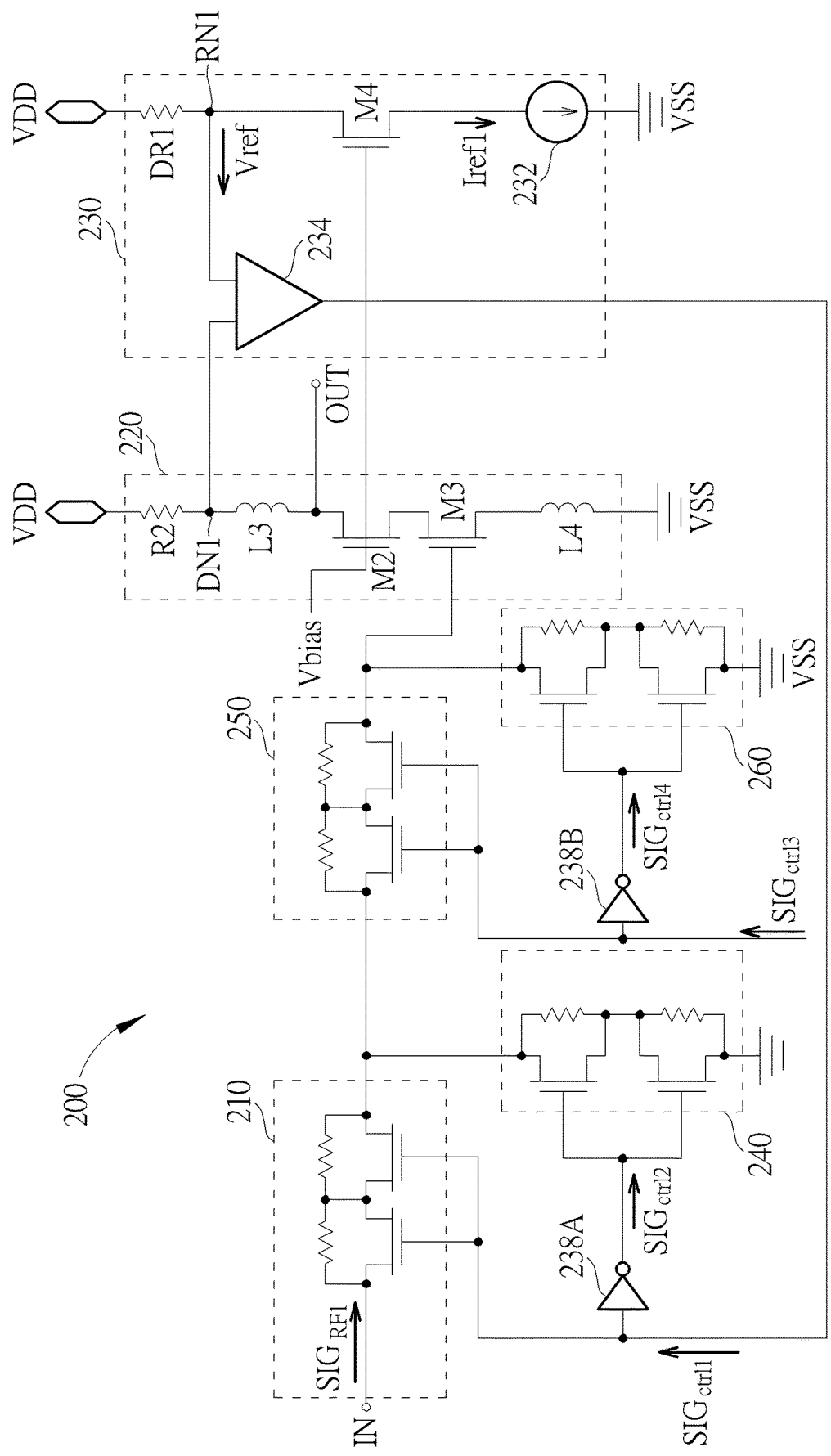
FIG. 3 is a schematic diagram of an amplifier circuit according to another embodiment of the invention.

In some embodiments, the amplifier 120 of the amplifier circuit 100 may further include other components to accommodate the system requirements. In such a case, the control circuit 130 may also be adjusted accordingly to provide a corresponding reference voltage at the reference node RN1. FIG. 3 is a schematic diagram of an amplifier circuit 200 according to an embodiment of the invention. The amplifier circuit 200 and the amplifier circuit 100 may be similar in structures and operate according to similar principles. In FIG. 3, the amplifier 220 may include a resistor R2, a transistor M2 and a transistor M3. The amplifier 220 may further include an inductor L3 and an inductor L4.

The resistor R2 has a first terminal and a second terminal. The first terminal of the resistor R2 may be coupled to the system voltage terminal VDD, and the second terminal of the resistor R2 may be coupled to the detection node DN1. The inductor L3 has a first terminal and a second terminal. The first terminal of the inductor L3 may be coupled to the second terminal of the resistor R2. The transistor M2 has a first terminal, a second terminal and a control terminal. The first terminal of the transistor M2 may be coupled to the second terminal of the inductor L3 and the output terminal OUT of the amplifier 220, the control terminal of the transistor M2 may be coupled to a bias terminal Vbias. The transistor M3 has a first terminal, a second terminal and a control terminal. The first terminal of the transistor M3 may be coupled to the second terminal of the transistor M2, the control terminal of the transistor M3 may be coupled to the input terminal of the amplifier 220. The inductor L4 has a first terminal and a second terminal. The first terminal of the inductor L4 may be coupled to the second terminal of the transistor M3, and the second terminal of the inductor L4 may be coupled to a system voltage terminal VSS.

The control circuit 230 may further include a reference resistor DR1, a transistor M4 and a comparator 234. The control circuit 230 may further include a current source 232. The transistor M4 has a first terminal, a second terminal and a control terminal. The first terminal of the transistor M4 may be coupled to the second terminal of the reference resistor DR1, the second terminal of the transistor M4 may be coupled to the current source 232, and the control terminal of the transistor M4 may be coupled to the bias terminal Vbias. In this manner, the control circuit 230 may provide at the reference node RN1 a voltage corresponding to the detection node DN1 of the amplifier 220.

In FIG. 3, the amplifier circuit 200 may further include switch circuits 250 and 260. The switch circuit 250 and the switch circuit 210 may be similar in structures and operate according to similar principles. The switch circuit 210 has a first terminal, a second terminal and a control terminal. The first terminal of the switch circuit 210 may be coupled to a radio frequency signal input terminal IN, and the control terminal of the switch circuit 210 may receive a first control signal $SIG_{ctrl1}$. The switch circuit 250 has a first terminal, a second terminal and a control terminal. The first terminal of the switch circuit 250 may be coupled to the second terminal of the switch circuit 210, the second terminal of the switch circuit 250 may be coupled to the input terminal of the amplifier 220, and the control terminal of the switch circuit 250 may receive a third control signal $SIG_{ctrl3}$ related to the first control signal $SIG_{ctrl1}$. For example, the first control signal $SIG_{ctrl1}$ may be identical to the third control signal $SIG_{ctrl3}$.

The switch circuit 240 has a first terminal, a second terminal and a control terminal. The first terminal of the switch circuit 240 may be coupled to the second terminal of the switch circuit 210, the second terminal of the switch circuit 240 may be coupled to the system voltage terminal VSS, and the control terminal of the switch circuit 240 may receive a second control signal $SIG_{ctrl2}$ related to the first control signal $SIG_{ctrl1}$. The switch circuit 260 has a first terminal, a second terminal and a control terminal. The first terminal of the switch circuit 260 may be coupled to the second terminal of the switch circuit 250, the second terminal of the switch circuit 260 may be coupled to the system voltage terminal VSS, and the control terminal of the switch circuit 260 may receive a fourth control signal $SIG_{ctrl4}$ related to the first control signal $SIG_{ctrl1}$.

In FIG. 3, the control circuit 230 may generate the first control signal $SIG_{ctrl1}$ and may employ an inverter 238A to generate the second control signal $SIG_{ctrl2}$ in an opposite phase to the first control signal $SIG_{ctrl1}$, and employ an inverter 238B to generate the fourth control signal $SIG_{ctrl4}$ in an opposite phase to the signal $SIG_{ctrl1}$. Therefore, the switch circuits 210 and 250 may operate synchronously, and the switch circuits 240 and 260 may also operate synchronously. In other words, when the control circuit 230 determines that the amplifier 220 is operating in the low power state, the control circuit 230 may turn on the switch circuits 210 and 250 and turn off switch circuits 240 and 260. When the control circuit 230 determines that the amplifier 220 is operating in the first high power state, the control circuit 230 may adjust the conduction levels of the switch circuits 210, 240, 250 and 260 according to the magnitude of the driving current Id. The conduction levels of the switch circuits 210 and 250 may be positively correlated, the conduction levels of the switch circuits 240 and 260 may be positively correlated, and the conduction levels of the switch circuits 210 and 240 may be negatively correlated. When the control circuit 230 determines that the amplifier 220 is operating in the second high power state, the control circuit 230 may turn off the switch circuits 210 and 250 and turn on switch circuits 240 and 260.

The present invention is not limited to the switch circuits 210 and 250 receiving identical signals. In some embodiments, the switch circuits 210 and 250 may receive the first control signal $SIG_{ctrl1}$ and a control signal related to the first control signal $SIG_{ctrl1}$, respectively. In some embodiments, the switch circuits 240 and 260 may receive the second control signal $SIG_{ctrl2}$, or share the same inverter to generate the second control signal $SIG_{ctrl2}$ after receiving the first control signal $SIG_{ctrl1}$.

Figure 4:
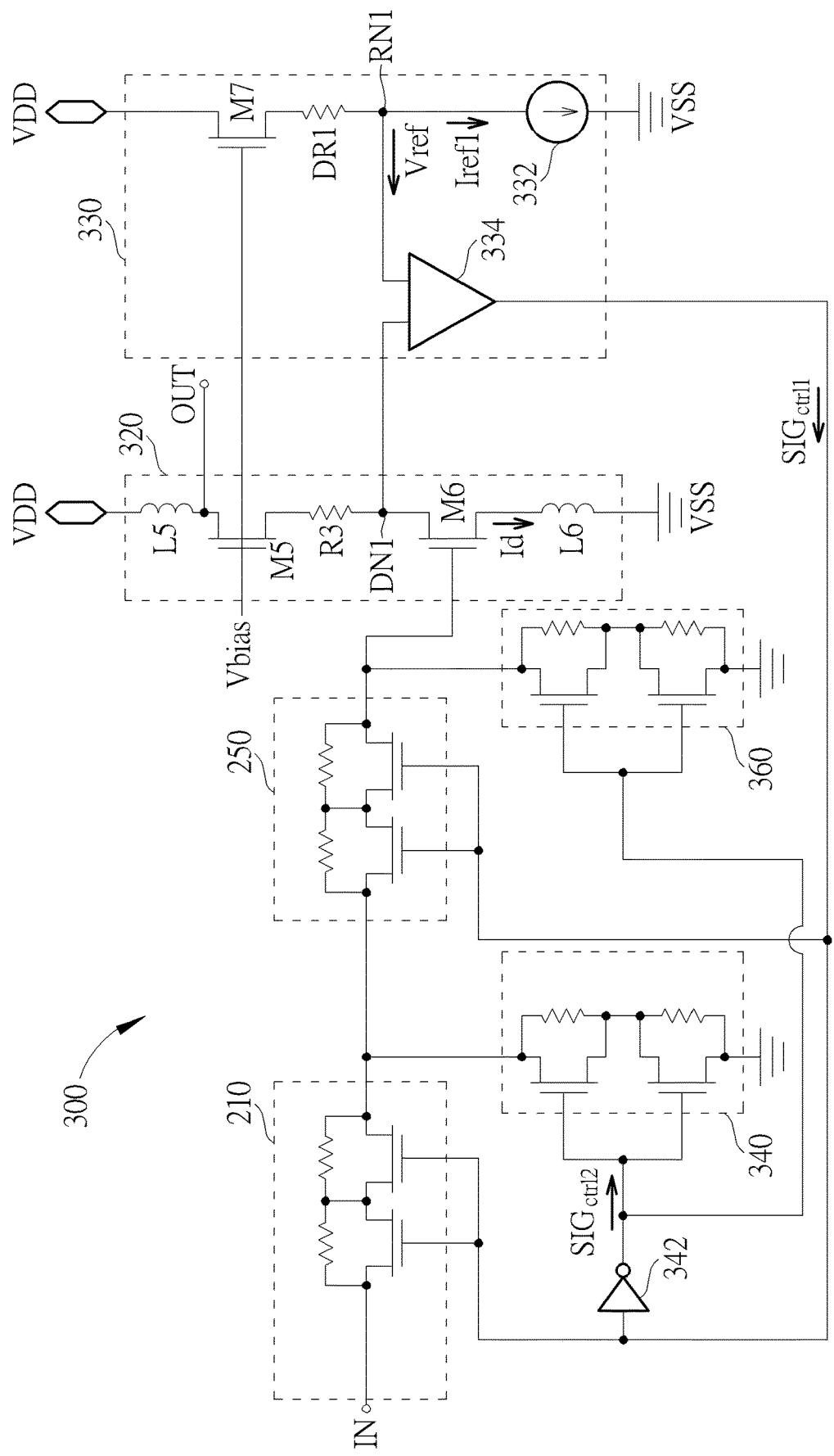
FIG. 4 is a schematic diagram of an amplifier circuit according to another embodiment of the invention.

FIG. 4 is a schematic diagram of an amplifier circuit 300 according to another embodiment of the present invention. The amplifier device 300 and the amplifier device 200 may be similar in structures and operate on similar principles. In the amplifier circuit 300, the amplifier 320 may include a transistor M5, a resistor R3 and a transistor M6. The amplifier 320 may further include an inductor L5 and an inductor L6. The inductor L5 has a first terminal and a second terminal. The first terminal of the inductor L5 may be coupled to the system voltage terminal VDD. The transistor M5 has a first terminal, a second terminal and a control terminal. The first terminal of the transistor M5 may be coupled to the second terminal of the inductor L5, and the control terminal of the transistor M5 may be coupled to a bias terminal Vbias. The resistor R3 has a first terminal and a second terminal. The first terminal of the resistor R3 may be coupled to the second terminal of the transistor M5, and the second terminal of the resistor R3 may be coupled to the detection node DN1. The transistor M6 has a first terminal, a second terminal and a control terminal. The first terminal of the transistor M6 may be coupled to the second terminal of the resistor R3, the control terminal of the transistor M6 may be coupled to the input terminal of the amplifier 320. The inductor L6 has a first terminal and a second terminal. The first terminal of the inductor L6 may be coupled to the second terminal of the transistor M6, and the second terminal of the inductor L6 may be coupled to a system voltage terminal VSS.

That is, compared to the amplifier circuit 200, the resistor R3 may be arranged between the transistor M5 and the transistor M6 of the amplifier circuit 300. In such a case, the transistor M7 and the reference resistor DR1 may be provided in the control circuit 330 to generate a voltage corresponding to the detection node DN1 at the reference node RN1. For example, the control circuit 330 may include a transistor M7. The transistor M7 has a first terminal, a second terminal and a control terminal. The first terminal of the transistor M7 may be coupled to the system voltage terminal VDD, the second terminal of the transistor M7 may be coupled to the first terminal of the reference resistor DR1, and the control terminal of the transistor M7 may be coupled to the bias terminal Vbias. The second terminal of the reference resistor DR1 may be coupled to the reference node RN1 and the current source 332.

Further, in the amplifier circuit 300, the switch circuit 340 may include an inverter 342, and the inverter 342 may invert the first control signal $SIG_{ctrl1}$ to generate a second control signal $SIG_{ctrl2}$. Furthermore, the switch circuit 360 may receive the second control signal $SIG_{ctrl2}$ generated by the inverter 342 to reduce the number of the components required.

In the amplifier circuits 100, 200, and 300, in order to provide a voltage related to the driving current Id at the detection node DN1, the resistors R1, R2, and R3 are provided in the amplifiers 120, 220, and 320, respectively. Nevertheless, in some embodiments, the linearity of the amplifiers 120, 220 and 320 may decrease owing to the voltage drops across the resistors R1, R2 and R3. Therefore, in some embodiments, the amplifier circuit may set the detection node outside the amplifier circuit, such as in the control circuit, to prevent the linearity of the amplifier from being affected.

Figure 5:
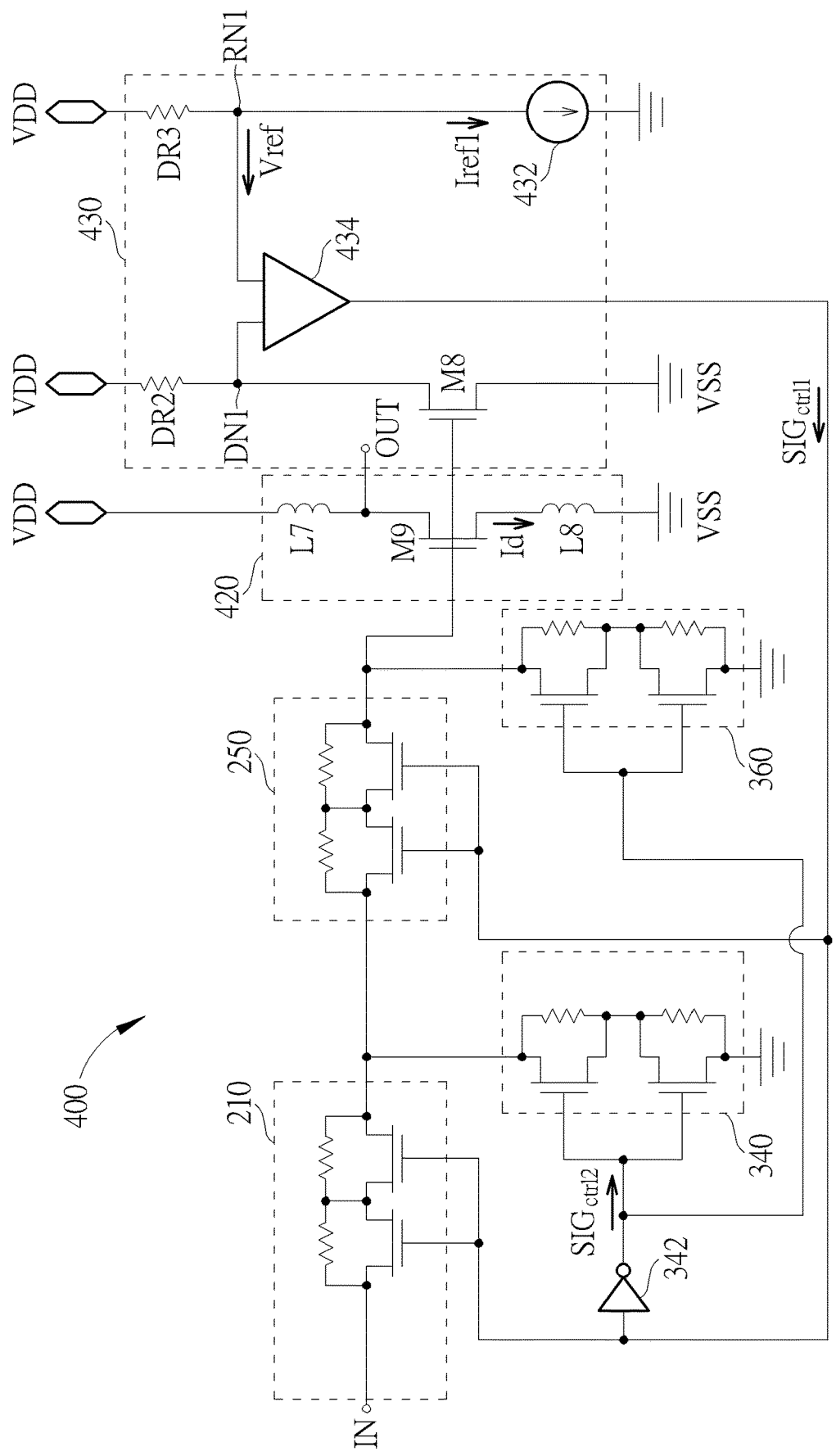
FIG. 5 is a schematic diagram of an amplifier circuit according to another embodiment of the invention.

FIG. 5 is a schematic diagram of an amplifier circuit 400 according to another embodiment of the present invention. The amplifier device 400 and the amplifier device 100 may be similar in structures and operate on similar principles. The amplifier 420 may include a transistor M9. The amplifier 420 may further include an inductor L7 and an inductor L8. The inductor L7 has a first terminal and a second terminal. The first terminal of the inductor L7 may be coupled to the system voltage terminal VDD, and the second terminal of the inductor L7 may be coupled to the output terminal of the amplifier 420. The transistor M9 has a first terminal, a second terminal and a control terminal. The first terminal of the transistor M9 may be coupled to the second terminal of the inductor L7 and the output terminal of the amplifier 420, the control terminal of the transistor M9 may be coupled to the input terminal of the amplifier 420. The inductor L8 has a first terminal and a second terminal. The first terminal of the inductor L8 may be coupled to the second terminal of the transistor M9, and the second terminal of the inductor L8 may be coupled to the system voltage terminal VSS.

In such a case, the control circuit 430 may include a reference resistor DR2, a transistor M8 and a comparator 434. The control circuit 430 may further include a current source 432.

The reference resistor DR2 has a first terminal and a second terminal. The first terminal of the reference resistor DR2 may be coupled to the system voltage terminal VDD, and the second terminal of the reference resistor DR2 may be coupled to the detection node DN1. The transistor M8 has a first terminal, a second terminal and a control terminal. The first terminal of the transistor M8 may be coupled to the second terminal of the reference resistor DR2, the second terminal of the transistor M8 may be coupled to the system voltage terminal VSS, and the control terminal of the transistor M8 may be coupled to the input terminal of the amplifier 420. In this manner, the current generated by the transistor M8 varies synchronously with the current generated by the transistor M9 of the amplifier 420, and the voltage at the detection node DN1 is also related to the driving current Id.

The reference resistor DR3 has a first terminal and a second terminal. The first terminal of the reference resistor DR3 may be coupled to the system voltage terminal VDD, and the second terminal of the reference resistor DR3 may be coupled to the reference node RN1 to generate the reference voltage Vref according to the reference current Iref1. The current source 432 may be coupled to the reference resistor DR3, and may provide a reference current Iref1 to produce a voltage drop across the reference resistor DR3.

The comparator 434 has a first input terminal, a second input terminal and an output terminal. The first input terminal of the comparator 434 may be coupled to the detection node DN1, the second input terminal of the comparator 434 may be coupled to the reference node RN1 to receive the reference voltage Vref, and the output terminal of the comparator 434 may output the first control signal $SIG_{ctrl1}$ according the voltage at the first input terminal and the voltage at the second input terminal to control the switch circuits 210, 340, 250, and 360.

In the amplifier circuit 400, since the control circuit 430 may generate a voltage related to the driving current Id at the detection node DN1 via the transistor M8 and the reference resistor DR2, no resistor is used in the amplifier 420, preventing the linearity of the amplifier 420 from being affected. Further, in some embodiments, since the transistor M8 is primarily used to provide a synchronous operation with the transistor M9 to generate a detection voltage related to the driving current Id at the reference resistor DR2, the size of the transistor M8 may be smaller than the size of the transistor M9, further reducing the circuit area required by the control circuit 430. In some embodiments, the width-to-length ratio of the channel of the transistor M9 may be, but is not limited to, eight times the width-to-length ratio of the channel of the transistor M8.

Figure 6:
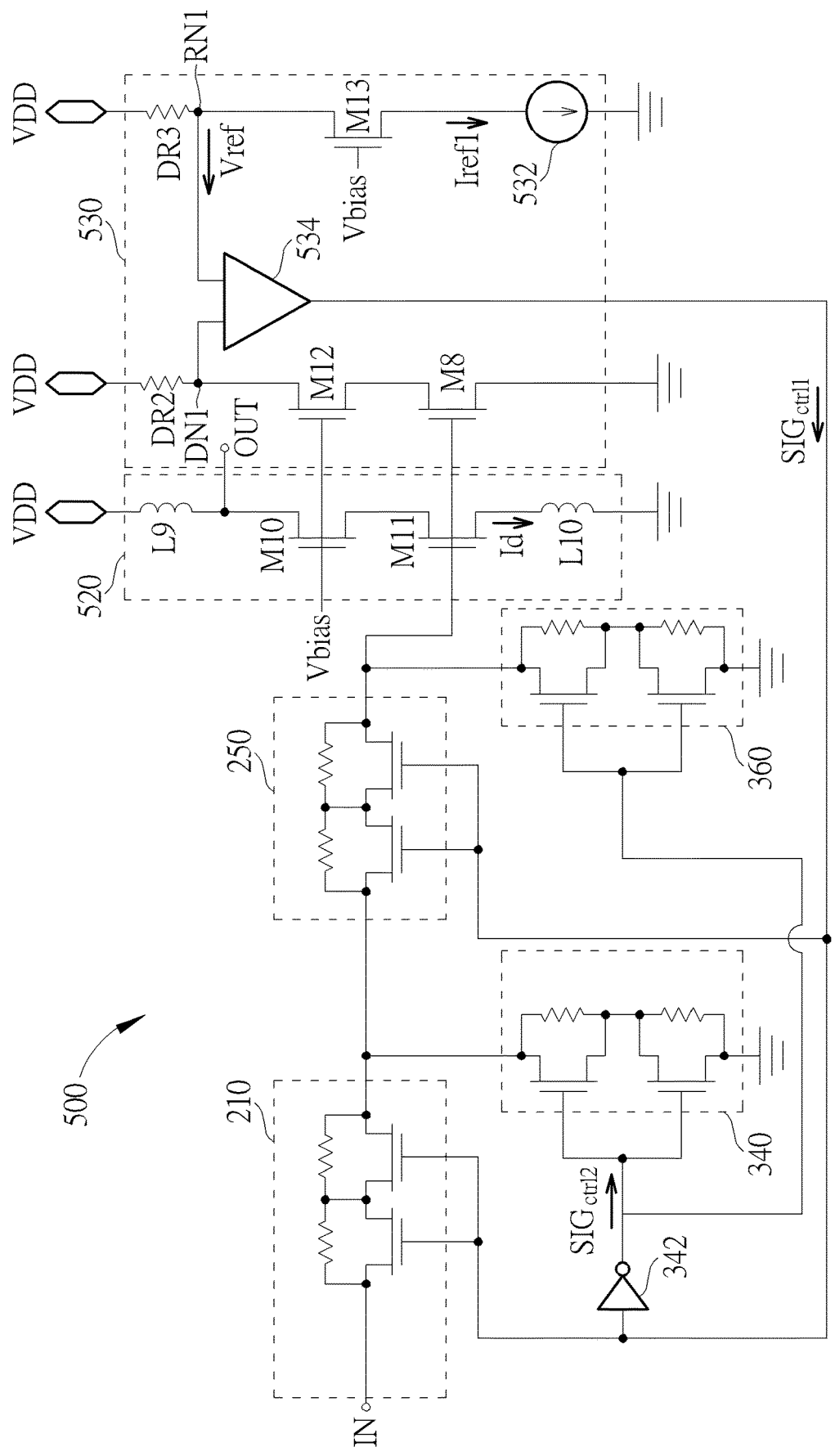
FIG. 6 is a schematic diagram of an amplifier circuit according to another embodiment of the invention.

FIG. 6 is a schematic diagram of an amplifier circuit 500 according to another embodiment of the present invention. The amplifier device 500 and the amplifier device 200 may be similar in structures and operate on similar principles. In FIG. 6, the amplifier 520 may include a transistor M10 and a transistor M11. The amplifier 520 may further include an inductor L9 and an inductor L10. The inductor L9 has a first terminal and a second terminal. The first terminal of the inductor L9 may be coupled to the system voltage terminal VDD. The transistor M10 has a first terminal, a second terminal and a control terminal. The first terminal of the transistor M10 may be coupled to the second terminal of the inductor L9 and the output terminal OUT of the amplifier 520, the control terminal of the transistor M10 may be coupled to a bias terminal Vbias. The transistor M11 has a first terminal, a second terminal and a control terminal. The first terminal of the transistor M11 may be coupled to the second terminal of the transistor M10, the control terminal of the transistor M11 may be coupled to the input terminal of the amplifier 520. The inductor L10 has a first terminal and a second terminal. The first terminal of the inductor L10 may be coupled to the second terminal of the transistor M11, and the second terminal of the inductor L10 may be coupled to a system voltage terminal VSS.

In such a case, the control circuit 530 may include a reference resistor DR2, a transistor M8, a comparator 534, the transistor M12 and the transistor M13. The control circuit 530 may further include a current source 532. The transistor M12 has a first terminal, a second terminal and a control terminal. The first terminal of the transistor M12 may be coupled to the second terminal of the reference transistor DR2, the second terminal of the transistor M12 may be coupled to the first terminal of the transistor M8, and the control terminal of the transistor M12 may be coupled to the bias terminal Vbias. In this manner, the current generated by the transistors M8 and M12 vary synchronously with the current generated by the transistors M11 and M10 of the amplifier 520, and the voltage at the detection node DN1 is also related to the driving current Id.

The transistor M13 has a first terminal, a second terminal and a control terminal. The first terminal of the transistor M13 may be coupled to the second terminal of the reference resistor DR3, the second terminal of the transistor M13 may be coupled to the current source 532, and the control terminal of the transistor M13 may be coupled to the bias terminal Vbias.

In the amplifier circuit 500, since the control circuit 530 may generate a voltage related to the driving current Id at the detection node DN1 via the transistor M8, the transistor M12 and the reference resistor DR2, no resistor is employed in the amplifier 520, preventing the linearity of the amplifier 520 from being affected.

In the control circuit 530, the detection node DN1 is set between the transistor M12 and the reference resistor DR2, and the reference node RN1 is set between the transistor M13 and the reference resistor DR3. However, in some embodiments, the detection node DN1 and the reference node RN1 may also be set in other locations.

Figure 7:
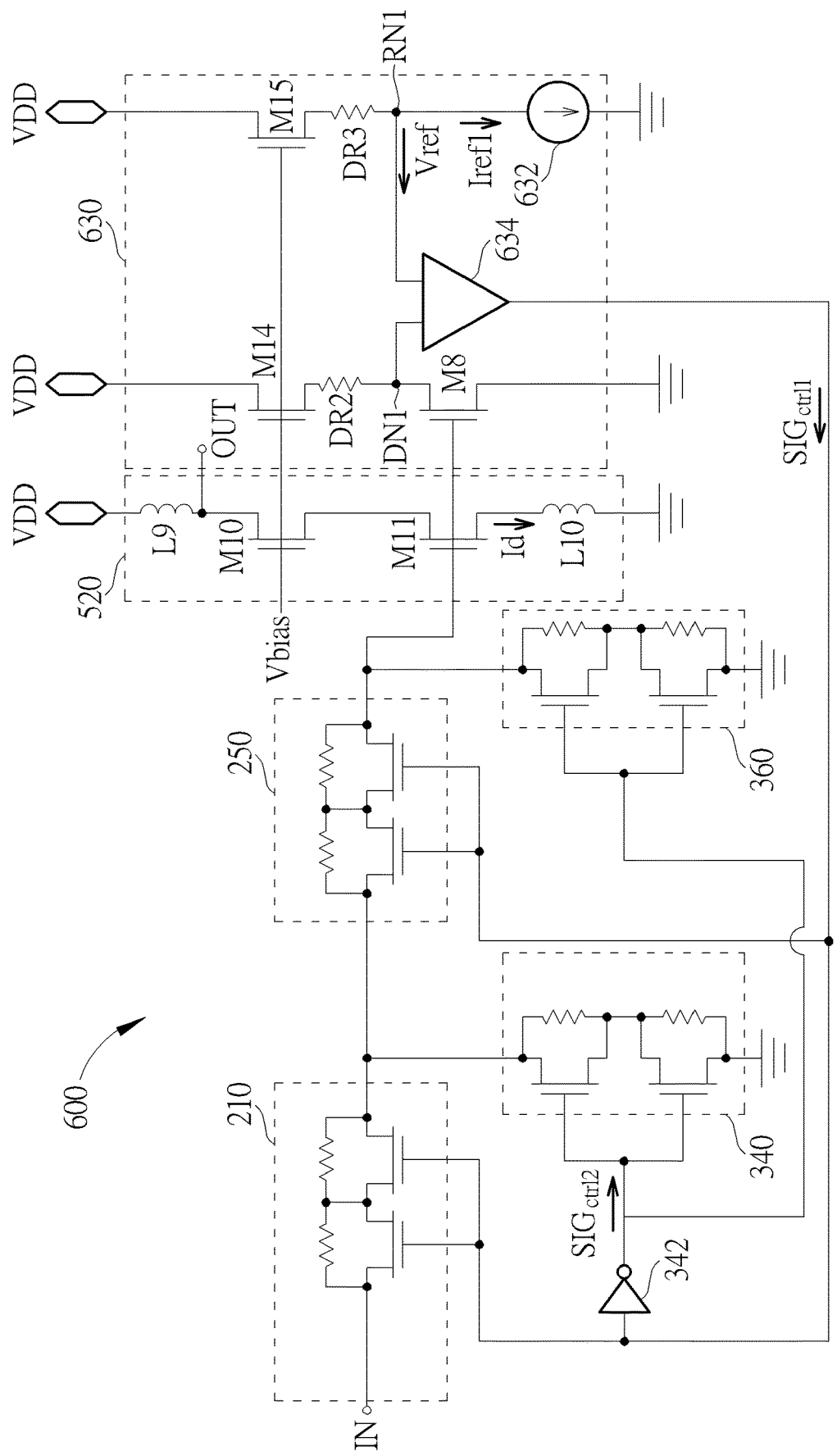
FIG. 7 is a schematic diagram of an amplifier circuit according to another embodiment of the invention.

FIG. 7 is a schematic diagram of an amplifier circuit 600 according to another embodiment of the present invention. The amplifier device 600 and the amplifier device 500 may be similar in structures and operate on similar principles. In FIG. 7, the control circuit 630 may include a reference resistor DR2, a reference resistor DR3, a transistor M8, a comparator 634, a transistor M14, and a transistor M15. The control circuit 630 may further include a current source 632.

The transistor M14 has a first terminal, a second terminal and a control terminal. The first terminal of the transistor M14 may be coupled to the system voltage terminal VDD, the second terminal of the transistor M14 may be coupled to the first terminal of the reference resistor DR2, and the control terminal of the transistor M14 may be coupled to a bias terminal Vbias. In this manner, the current generated by the transistors M8 and M14 may vary synchronously with the current generated by the transistors M11 and M10 in the amplifier 520, and the voltage at the detection node DN1 is also related to the driving current Id.

The transistor M15 has a first terminal, a second terminal and a control terminal. The first terminal of the transistor M15 may be coupled to the system voltage terminal VDD, the second terminal of the transistor M15 may be coupled to the first terminal of the reference resistor DR3, and the control terminal of the transistor M15 may be coupled to the bias terminal Vbias. In FIG. 7, the detection node DN1 may be set between the reference resistor DR2 and the transistor M8, and the reference node RN1 may be set between the reference resistor DR3 and the current source 632.

While the control circuits 130 to 630 of the amplifier circuits 100 to 600 may adopt the current sources 132 to 632 to generate voltage drops across the reference resistor DR1 or DR3 to provide a corresponding reference voltage Vref at the reference node RN1, the current sources 132 to 632 may be replaced by voltage divider resistors in some embodiments.

Figure 8:
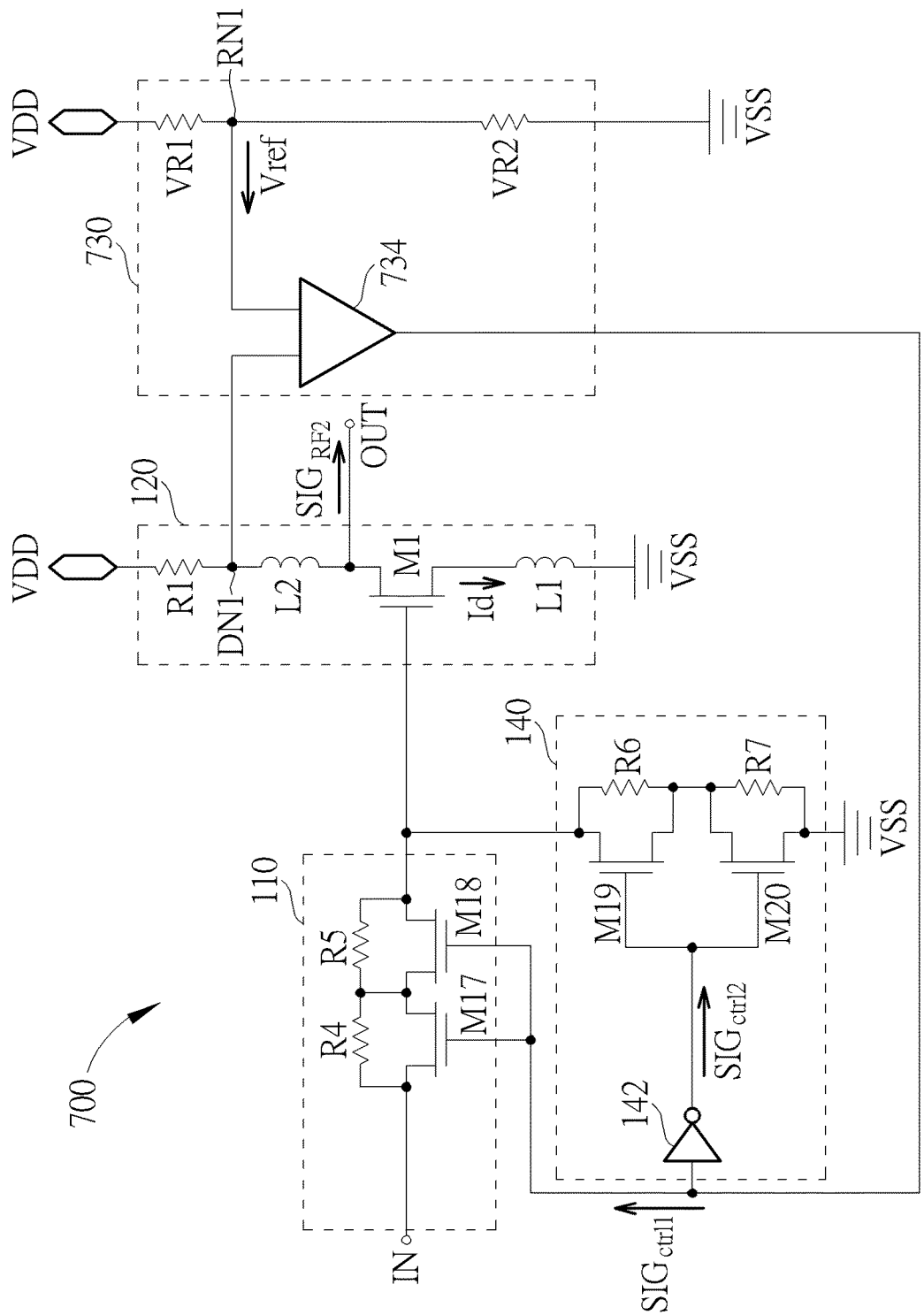
FIG. 8 is a schematic diagram of an amplifier circuit according to another embodiment of the invention.

FIG. 8 is a schematic diagram of an amplifier circuit 700 according to another embodiment of the present invention. The amplifier device 700 and the amplifier device 100 may be similar in structures and operate on similar principles. In FIG. 8, the control circuit 730 may include a voltage divider resistor VR1, a voltage divider resistor VR2 and a comparator 734. The voltage divider resistor VR1 has a first terminal and a second terminal. The first terminal of the voltage divider resistor VR1 may be coupled to the system voltage terminal VDD, and the second terminal of the voltage divider resistor VR1 may be coupled to the reference node RN1. The voltage divider resistor VR2 has a first terminal and a second terminal. The first terminal of the voltage divider resistor VR2 may be coupled to the reference node RN1 to provide the reference voltage Vref, and the second terminal of the voltage divider resistor VR2 may be coupled to the system voltage terminal VSS.

In such a case, by selecting appropriate resistance of the voltage divider resistors VR1 and VR2, the required reference voltage Vref may be provided at the reference node RN1, so as to enable the comparator 734 to correspondingly output the first control signal $SIG_{ctrl1}$.

The amplifier circuits provided by the embodiments of the present invention may control the switch circuits at the input terminal of the amplifier according to the driving current of the amplifier, so as to prevent the amplifier from being damaged by an excessively high power.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit comprising:
    a first switch circuit, comprising a first terminal coupled to a radio frequency signal input terminal or a first system voltage terminal, a second terminal, and a control terminal configured to receive a first control signal;
    an amplifier, comprising an input terminal coupled to the second terminal of the first switch circuit and configured to receive a radio frequency signal, and an output terminal configured to output an amplified radio frequency signal; and
    a control circuit, coupled to the amplifier, and configured to generate the first control signal according to a driving current generated by the amplifier;
    wherein:
    when the control circuit determines that the amplifier is operating in a first high power state, the control circuit outputs the first control signal according to a magnitude of the driving current to adjust a conduction level between the first terminal and the second terminal of the first switch circuit.

2. The amplifier circuit of claim 1, wherein the control circuit comprises:
    a comparator, comprising a first input terminal coupled to a detection node, a second input terminal coupled to a reference node and configured to receive a reference voltage, and an output terminal, wherein the comparator outputs the first control signal according to a voltage at the first input terminal and the reference voltage at the second input terminal, and the voltage at the first input terminal is related to the driving current.

3. The amplifier circuit of claim 2, wherein the control circuit further comprises:
    a first voltage divider resistor, comprising a first terminal coupled to a second system voltage terminal, and a second terminal coupled to the reference node; and
    a second voltage divider resistor, comprising a first terminal coupled to the reference node and configured to provide the reference voltage, and a second terminal coupled to the first system voltage terminal.

4. The amplifier circuit of claim 2, wherein the control circuit further comprises:
    a first reference resistor, comprising a first terminal coupled to a second system voltage terminal, and a second terminal coupled to the reference node, the first reference resistor provides the reference voltage according to a reference current.

5. The amplifier circuit of claim 4, wherein the amplifier comprises:
    a first resistor, comprising a first terminal coupled to a second system voltage terminal, and a second terminal coupled to the detection node; and
    a first transistor, comprising a first terminal coupled to the output terminal of the amplifier, a second terminal, and a control terminal coupled to the input terminal of the amplifier.

6. The amplifier circuit of claim 2, wherein the amplifier comprises:
    a second resistor, comprising a first terminal coupled to a second system voltage terminal, and a second terminal coupled to the detection node;
    a second transistor, comprising a first terminal coupled to the detection node and the output terminal of the amplifier, a second terminal, and a control terminal coupled to a bias terminal; and
    a third transistor, comprising a first terminal coupled to the second terminal of the second transistor, a second terminal, and a control terminal coupled to the input terminal of the amplifier.

7. The amplifier circuit of claim 6, wherein the control circuit further comprises:
a fourth transistor, comprising a first terminal coupled to the second terminal of a first reference resistor, a second terminal coupled to a first current source, and a control terminal coupled to the bias terminal.

8. The amplifier circuit of claim 2, wherein the amplifier comprises:
a fifth transistor, comprising a first terminal coupled to the output terminal of the amplifier, a second terminal, and a control terminal coupled to a bias terminal;
a third resistor, comprising a first terminal coupled to a second terminal of the fifth transistor, and a second terminal coupled to the detection node; and
a sixth transistor, comprising a first terminal coupled to the second terminal of the third resistor, a second terminal, and a control terminal coupled to the input terminal of the amplifier.

9. The amplifier circuit of claim 8, wherein the control circuit further comprises:
a seventh transistor, comprising a first terminal coupled to a second system voltage terminal, a second terminal coupled to the reference node, and a control terminal coupled to the bias terminal.

10. The amplifier circuit of claim 1, wherein the control circuit comprises:
a second reference resistor, comprising a first terminal coupled to a second system voltage terminal, and a second terminal coupled to a detection node;
an eighth transistor, comprising a first terminal coupled to the second terminal of the second reference resistor, a second terminal coupled to the first system voltage terminal, and a control terminal coupled to the input terminal of the amplifier; and
a comparator, comprising a first input terminal coupled to a detection node, a second input terminal coupled to a reference node and configured to receive a reference voltage, and an output terminal, wherein the comparator is configured to output the first control signal according to a voltage at the first input terminal and the reference voltage at the second input terminal, and the voltage at the first input terminal is related to the driving current.

11. The amplifier circuit of claim 10, wherein the control circuit further comprises:
a third reference resistor, comprising a first terminal coupled to the second system voltage terminal, and a second terminal coupled to the reference node, the third reference resistor being configured to generate the reference voltage according to a reference current.

12. The amplifier circuit of claim 11, wherein the amplifier comprises:
a ninth transistor, comprising a first terminal coupled to the output terminal of the amplifier, a second terminal, and a control terminal coupled to the input terminal of the amplifier.

13. The amplifier circuit of claim 11, wherein the amplifier comprises:
a tenth transistor, comprising a first terminal coupled to the output terminal of the amplifier, a second terminal, and a control terminal coupled to a bias terminal; and
an eleventh transistor, comprising a first terminal coupled to the second terminal of the tenth transistor, a second terminal, and a control terminal coupled to the input terminal of the amplifier.

14. The amplifier circuit of claim 13, wherein the control circuit further comprises:
a twelfth transistor, comprising a first terminal coupled to the second terminal of the second reference resistor, a second terminal coupled to the first terminal of the eighth transistor, and a control terminal coupled to the bias terminal; and
a thirteenth transistor, comprising a first terminal coupled to the second terminal of the third reference resistor, a second terminal, and a control terminal coupled to the bias terminal.

15. The amplifier circuit of claim 11, wherein the control circuit further comprises:
a fourteenth transistor, comprising a first terminal coupled to the second system voltage terminal, a second terminal coupled to the first terminal of the second reference resistor, and a control terminal coupled to a bias terminal; and
a fifteenth transistor, comprising a first terminal coupled to the second system voltage terminal, a second terminal coupled to the first terminal of the third reference resistor, and a control terminal coupled to the bias terminal.

16. The amplifier circuit of claim 1, wherein:
the first terminal of the first switch circuit is coupled to the radio frequency signal input terminal;
when the control circuit determines that the amplifier is operating in a low power state, the control circuit controls the first control signal to turn on the first switch circuit; and
when the control circuit determines that the amplifier is operating in a second high power state, the control circuit controls the first control signal to turn off the first switch circuit.

17. The amplifier circuit of claim 16, further comprising:
a second switch circuit, comprising a first terminal coupled to the second terminal of the first switch circuit, a second terminal coupled to the first system voltage terminal, and a control terminal configured to receive the first control signal or a second control signal related to the first control signal;
wherein:
when the control circuit determines that the amplifier is operating in the first high power state, the control circuit adjusts the conduction level between the first terminal and the second terminal of the second switch circuit according to the magnitude of the driving current;
when the control circuit determines that the amplifier is operating in a low power state, the control circuit is configured to turn off the second switch circuit; and
when the control circuit determines that the amplifier is operating in a second high power state, the control circuit is configured to turn on the second switch circuit.

18. The amplifier circuit of claim 17, wherein the second switch circuit further comprises:
an inverter, comprising an input terminal configured to receive the first control signal, and an output terminal configured to output the second control signal.

19. The amplifier circuit of claim 17, further comprising:
a third switch circuit, comprising a first terminal coupled to the second terminal of the first switch circuit, a second terminal coupled to the input terminal of the amplifier, and a control terminal configured to receive the first control signal or a third control signal related to the first control signal; and an fourth switch circuit, comprising a first terminal coupled to the second terminal of the third switch circuit, a second terminal coupled to the first system voltage terminal, and a control terminal configured to receive a fourth control signal related to the first control signal;

wherein:

when the control circuit determines that the amplifier is operating in the first high power state, the control circuit adjusts a conduction level between the first terminal and the second terminal of the third switch circuit and adjust a conduction level between the first terminal and the second terminal of the fourth switch circuit according to the magnitude of the driving current;

when the control circuit determines that the amplifier is operating in the low power state, the control circuit turns on the third switch circuit and turn off the fourth switch circuit; and when the control circuit determines that the amplifier is operating in the second high power state, the control circuit turns off the third switch circuit and turn on the fourth switch circuit.

20. The amplifier circuit of claim 1, wherein the first terminal of the first switch circuit is coupled to the first system voltage terminal, wherein:

when the control circuit determines that the amplifier is operating in a low power state, the control circuit controls the first control signal to turn off the first switch circuit; and when the control circuit determines that the amplifier is operating in a second high power state, the control circuit controls the first control signal to turn on the first switch circuit.

* * * * *